(12) United States Patent
Hu et al.

(10) Patent No.: US 12,745,482 B2
(45) Date of Patent: Sep. 22, 2026

(54) SOLAR CELL

(71) Applicant: TRINA SOLAR CO., LTD., Changzhou (CN)

(72) Inventors: Yunyun Hu, Changzhou (CN); Guanchao Xu, Changzhou (CN); Zhuohan Zhang, Changzhou (CN); Xueling Zhang, Changzhou (CN); Daming Chen, Changzhou (CN); Yifeng Chen, Changzhou (CN); Zhiqiang Feng, Changzhou (CN); Pietro Peter Altermatt, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/704,439

(22) PCT Filed: Oct. 26, 2022

(86) PCT No.: PCT/CN2022/127773

§ 371 (c)(1),
(2) Date: Apr. 24, 2024

(87) PCT Pub. No.: WO2023/072164

PCT Pub. Date: May 4, 2023

(65) Prior Publication Data

US 2025/0006853 A1 Jan. 2, 2025

(30) Foreign Application Priority Data

Oct. 27, 2021 (CN) ........................ 202111254049.6

(51) Int. Cl.
*H10F 77/122* (2025.01)
*H10F 77/30* (2025.01)

(52) U.S. Cl.
CPC ......... *H10F 77/122* (2025.01); *H10F 77/311* (2025.01)

(58) Field of Classification Search
CPC ............................ H10F 77/122; H10F 77/311
See application file for complete search history.

(56) References Cited

U.S. PATENT DOCUMENTS

2011/0139231 A1* 6/2011 Meier .................. H10F 71/121 257/E31.119
2019/0131472 A1* 5/2019 Hsiao ..................... H10F 77/14
(Continued)

FOREIGN PATENT DOCUMENTS

CN 107195699 A 9/2017
CN 108666393 A 10/2018
(Continued)

OTHER PUBLICATIONS

International Search Report dated Jan. 4, 2023 received in International Application No. PCT/CN2022/127775.
International Search Report dated Jan. 18, 2023 received in International Application No. PCT/CN2022/127773.
Chinese Patent Office, First Office Action issued in corresponding Application No. 202111254049.6, dated Dec. 6, 2024, 17 pp.
(Continued)

*Primary Examiner* — Lindsey A Buck
(74) *Attorney, Agent, or Firm* — Taft, Stettinius & Hollister LLP

(57) ABSTRACT

A solar cell is provided. The solar cell includes a semiconductor substrate. The front surface of the semiconductor substrate has a metal contact area and a non-metal contact area. A first tunneling layer, a first doped polysilicon layer and a first metal electrode are sequentially stacked on the metal contact area. The first metal electrode is electrically connected to the first doped polysilicon layer. A second tunneling layer, a second doped polysilicon layer and a second metal electrode are sequentially stacked on the back surface of the semiconductor substrate.

15 Claims, 3 Drawing Sheets

(56) References Cited

U.S. PATENT DOCUMENTS

| | | | | |
|---|---|---|---|---|
| 2020/0075789 | A1 | 3/2020 | Loper et al. | |
| 2020/0287066 | A1* | 9/2020 | Stodolny | H10F 19/80 |

FOREIGN PATENT DOCUMENTS

| | | | | |
|---|---|---|---|---|
| CN | 111180551 A | 5/2020 | | |
| CN | 111628049 A | 9/2020 | | |
| CN | 111628050 A | 9/2020 | | |
| CN | 112186049 A | 1/2021 | | |
| CN | 112201701 A | 1/2021 | | |
| CN | 113644142 A | 11/2021 | | |
| CN | 114497241 A | 5/2022 | | |
| CN | 216597604 U | 5/2022 | | |
| JP | 2010521824 A | 6/2010 | | |
| WO | WO-2016049245 A1 * | 3/2016 | | H01L 21/265 |
| WO | 2017004624 A1 | 1/2017 | | |
| WO | 2021203813 A1 | 10/2021 | | |
| WO | 2023072165 A1 | 5/2023 | | |

OTHER PUBLICATIONS

Chinese Patent Office, Second Office Action issued in corresponding Application No. 202111254049.6, dated Apr. 19, 2025, 17 pp.

European Patent Office, Extended Search Report issued in corresponding Application No. 22886039.1, dated Feb. 3, 2025, 10 pp.

Bo et al., "Passivation Technique of n-Type Bifacial TOPCon Solar Cells," Semiconductor Technology, 2019, vol. 44, No. 5, pp. 368-373, English Abstract included.

Jain et al., "Design, Optimization, and In-Depth Understanding of Front and Rear Junction Double-Side Passivated Contacts Solar Cells," IEEE Journal of Photovoltaics, 2021, vol. 11, No. 5, pp. 1141-1148.

Ling et al., "Double-Sided Passivated Contacts for Solar Cell Applications: An Industrially Viable Approach Toward 24% Efficient Large Area Silicon Solar Cells," Silicon Materials, IntechOpen, 2019, 45 pp.

* cited by examiner

SOLAR CELL

CROSS REFERENCE TO RELATED APPLICATION

This application claims priority to Chinese Patent Application 202111254049.6, filed with the Chinese National Intellectual Property Administration on Oct. 27, 2021 and entitled "A Passivated Contact Solar Cell", the entire contents of which are incorporated herein by reference.

TECHNICAL FIELD

This application is related to the technical field of crystalline silicon solar cell design and relates to a passivated contact solar cell.

BACKGROUND

In crystalline silicon solar cells, surface recombination and recombination in the metal-semiconductor contact area are key factors that restrict the improvement of solar cell efficiency.

The current cell technology is tunnel oxide passivated contact (Topcon) technology. However, due to the large absorption coefficient of the polysilicon layer in solar cells, it will cause serious parasitic absorption and current loss. Therefore, the conventional Topcon technology is only suitable for solar cells which have a passivated contact structure only on the back surface (non-main light-receiving surface), and a traditional heavily doped or selectively doped emitter is provided on the front surface (main light-receiving surface).

SUMMARY

In view of the shortcomings of the existing technology, the purpose of this application is to provide a solar cell. In this application, the metal-semiconductor contact areas on the front surface and the back surface of the semiconductor substrate can be passivated at the same time, thereby reducing the carrier recombination of the contact areas on both surfaces. Furthermore, the emitter can be placed on the back surface, and therefore reducing the carrier recombination in the non-contact area of the front surface, thereby obtaining higher open circuit voltage and higher conversion efficiency than the conventional Topcons.

To achieve this purpose, this application adopts the following technical solutions.

The present application provides a solar cell comprising a semiconductor substrate, and the front surface of the semiconductor substrate has a metal contact area and a non-metal contact area,

- along the direction away from the front surface of the semiconductor substrate, a first tunneling layer, a first doped polysilicon layer and a first metal electrode are sequentially stacked on the metal contact area, wherein the first metal electrode is electrically connected to the first doped polysilicon layer,
- along the direction away from the back surface of the semiconductor substrate, a second tunneling layer, a second doped polysilicon layer and a second metal electrode are sequentially stacked on the back surface of the semiconductor substrate,
- the front surface of the semiconductor substrate is the main light-receiving surface, and the back surface of the semiconductor substrate is the non-main light-receiving surface, the semiconductor substrate and the first doped polysilicon layer have the same conductivity type, and the semiconductor substrate and the second doped polysilicon layer have different conductivity types.

In this application, the metal-semiconductor contact areas on the front surface and the back surface of the semiconductor substrate can be passivated at the same time to reduce the carrier recombination in the contact areas on both surfaces, and the emitter is placed on the back surface, which can reduce the carrier recombination in the non-contact area of the front surface, resulting in higher open circuit voltage and higher conversion efficiency than conventional Topcons.

As an optional technical solution of this application, the non-metal contact area is covered with a first dielectric layer.

As an optional technical solution of the present application, along the direction away from the front surface of the semiconductor substrate, the non-metal contact area is sequentially provided with a third tunneling layer, a third doped polysilicon layer and the first dielectric layer.

As an optional technical solution of this application, the first tunneling layer and the third tunneling layer are arranged in the same layer, the first doped polysilicon layer and the third doped polysilicon layer are arranged in the same layer, and the thickness of the first doped polysilicon layer is greater than the thickness of the third doped polysilicon layer.

As an optional technical solution of this application, the thickness of the third tunneling layer is ≤3 nm, the thickness of the third doped polysilicon layer is 1~1000 nm, and the sheet resistance of the third doped polysilicon layer is 1~1000 ohm/sq.

As an optional technical solution of the present application, the non-metal contact area of the semiconductor substrate is doped with a first lightly doped layer, the first lightly doped layer is covered with the first dielectric layer.

As an optional technical solution of this application, the sheet resistance of the first lightly doped layer is 50-1000 ohm/sq.

As an optional technical solution of this application, the first dielectric layer includes any one or any combination of silicon nitride, silicon oxide, silicon oxynitride, silicon carbide, aluminum oxide, gallium oxide, zinc oxide, titanium oxide or magnesium fluoride.

As an optional technical solution of this application, the front surface of the semiconductor substrate is textured.

As an optional technical solution of this application, the thickness of the second tunneling layer is ≤3 nm, the thickness of the second doped polysilicon layer is 10-1000 nm.

As an optional technical solution of this application, the back surface of the semiconductor substrate is textured or polished.

As an optional technical solution of the present application, the back surface of the semiconductor substrate is at least partially textured or at least partially polished.

The back surface of the semiconductor substrate is partially textured and partially polished.

As an optional technical solution of the present application, the first tunneling layer and the second tunneling layer are dielectric films with carrier tunneling effect and interface passivation effect.

As an optional technical solution of this application, the first tunneling layer and the second tunneling layer are dielectric films of silicon oxide or aluminum oxide.

As an optional technical solution of this application, the thickness of the first tunneling layer is ≤3 nm, the thickness of the first doped polysilicon layer is 10-1000 nm.

Figure 1:
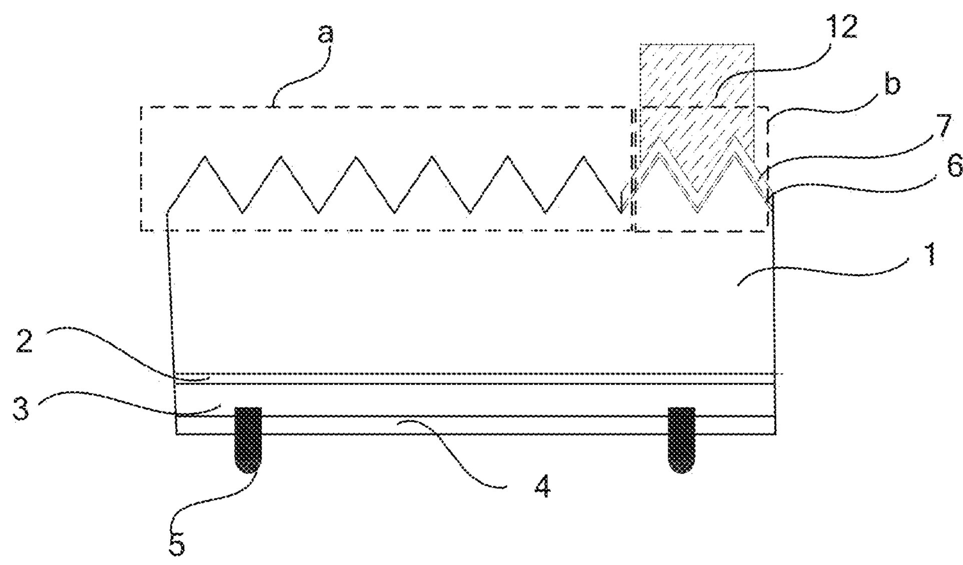
FIG. 1 is a structural schematic diagram of a solar cell structure provided by a specific embodiment of the present application.

Among them, 1: the semiconductor substrate, 2: the second tunneling layer, 3: the second doped polysilicon layer, 4: the second dielectric layer, 5: the second metal electrode, 6: the first tunneling layer, 7: the first doped polysilicon layer, 8: the first lightly doped layer, 9: the third doped polysilicon layer, 10: the third tunneling layer, 11: the first dielectric layer, 12: the first metal electrode.

DETAILED DESCRIPTION

It should be understood that in the description of this application, the terms that indicate orientations or positional relationships, such as "center", "longitudinal", "transverse", "upper", "lower", "front", "back", "left", "right", "vertical", "horizontal", "top", "bottom", "inner", "outer", etc. are based on the orientations or positional relationships shown in the drawings, and are only for the convenience of describing the present application and are not intended to indicate or imply that the device or element referred to must have a specific orientation, be constructed and operate in a specific orientation, and therefore should not be construed as a limitation on the present application. Furthermore, the terms "first", "second", etc. are used for descriptive purposes only and cannot be understood as indicating or implying relative importance or implicitly indicating the quantity of indicated technical features. Thus, features defined by "first," "second," etc. may explicitly or implicitly include one or more of such features. In the description of this application, unless otherwise stated, "plurality" means two or more.

It should be noted that in the description of this application, unless otherwise clearly stated and limited, the terms "placed", "connected" and "coupled" should be understood in a broad sense. For example, it can be a fixed connection or a detachable connection, or an integrated connection; it can be a mechanical connection or an electrical connection; it can be a direct connection or an indirect connection through an intermediate medium; it can be an internal connection between two components. For those of ordinary skill in the art, the specific meanings of the above terms in this application can be understood through specific circumstances.

In order to facilitate understanding of the solutions provided by the embodiments of this application, related terms are first introduced.

Heavily doped layer refers to a doped layer with a surface concentration not less than 1e19 $cm^{-3}$.

Lightly doped layer refers to a doped layer with a surface concentration no higher than 1e20 $cm^{-3}$.

The technical solution of the present application will be further described below with reference to the accompanying drawings and specific embodiments.

The solar cell disclosed in this application adopts Topcon technology. The passivated contact structure is formed by superimposing an ultra-thin tunnel oxide layer and a doped polysilicon layer on a crystalline silicon. The oxide layer is used to passivate the surface, and the doped polysilicon layer is used as a selective carrier contact material, which can significantly reduce carrier recombination in the metal-semiconductor contact area and has good contact performance, thus greatly improving the efficiency of solar cells.

In a specific embodiment, the present application provides a solar cell, as shown in FIGS. 1-4, which includes a semiconductor substrate 1. In the embodiment of the present application, the semiconductor substrate 1 may be made of crystalline silicon. It should be noted that the semiconductor substrate 1 includes but is not limited to crystalline silicon. By way of example, the semiconductor substrate 1 may be a first conductivity type semiconductor substrate. In this embodiment of the present application, the conductivity types are divided into a first conductivity type and a second conductivity type, and the first conductivity type and the second conductivity type may be N-type or P-type. For example, the first conductivity type is N type and the second conductivity type is P type, or the first conductivity type is P type and the second conductivity type is N type.

For the purpose of description, the front and back surfaces of the semiconductor substrate 1 are defined, wherein the front surface of the semiconductor substrate 1 is the main light-receiving surface, and the back surface of the semiconductor substrate 1 is the non-main light-receiving surface. The above-mentioned main light-receiving surface can be understood as the surface of the semiconductor substrate 1 facing the sunlight when the solar cell is in use, the non-main light-receiving surface is the other surface opposite to the main light-receiving surface.

The front surface of the semiconductor substrate 1 has a metal contact area b and a non-metal contact area a. Among them, the metal contact area b refers to the area in contact with the metal electrodes. The non-metal contact area a is the other area on the front surface of the semiconductor substrate 1 except the metal contact area b.

Referring to FIG. 1, FIG. 1 mainly shows the structure of the metal contact area b of the semiconductor substrate in the solar cell. Along the direction away from the front surface of the semiconductor substrate 1, a first tunneling layer 6, a first doped polysilicon layer 7 and a first metal electrode 12 are sequentially stacked on the surface of the metal contact area b. The first doped polysilicon layer 7 is electrically connected to the first metal electrode 12 of the semiconductor substrate 1. Among them, the first tunneling layer 6 is a tunneling layer in the metal contact area, the first doped polysilicon layer 7 is a doped polysilicon layer of the first conductivity type in the metal contact area. That is to say, in the embodiment of the present application, the conductivity type of the first doped polysilicon layer 7 and the conductivity type of the semiconductor substrate 1 are the same, such as P type, or N type. For example, when the semiconductor substrate 1 is an N-type semiconductor, the first doped polysilicon layer 7 is N-type doped, and the doping element is phosphorus, when the semiconductor substrate 1 is a P-type semiconductor, the first doped polysilicon layer 7 is P-type doped, and the doping element is boron.

In a specific arrangement, the first tunneling layer 6 is prepared in the metal contact area b, the first doped polysilicon layer 7 is deposited on the first tunneling layer 6 and covers the first tunneling layer 6, and the first metal electrode 12 contacts with the first doped polysilicon layer 7 and achieves an electrical connection. In addition, the first metal electrode 12 is a metal electrode of the front surface of the semiconductor substrate. During preparation, the first metal electrode 12 may be made by methods including, but not limited to, screen printing, electroplating, inkjet printing, laser transfer, evaporation or other metallization methods.

The first tunneling layer 6 is used to passivate the substrate surface. In the embodiment of the present application, if the first tunneling layer 6 is too thick, it will affect the tunneling and collection of carriers, and if the first tunneling layer 6 is too thin, it will affect the passivation effect of the semiconductor substrate 1. Therefore, in the embodiment of the present application, the thickness of the first tunneling layer 6 is 0.5~3 nm. For example, the thickness of the first tunneling layer 6 may be 0.5 nm, 1 nm, 1.5 nm, 2 nm, 2.5 nm, or 3 nm. It should be understood that the thickness of the first tunneling layer 6 is not limited to the listed values, and other unlisted values within this range are also applicable.

The first doped polysilicon layer 7 serves as a heavily doped layer and is used to form good electrical contact with the first metal electrode 12. In the embodiment of the present application, the surface concentration of the first doped polysilicon layer 7 is 1e18~1e22 $cm^{-3}$. The first doped polysilicon layer 7 is used to form ohmic contact with the first metal electrode 12. The heavily doped layer of the first doped polysilicon layer 7 can reduce the contact resistance when connected to the first metal electrode 12.

The thickness of the first doped polysilicon layer 7 is 10~1000 nm, for example, it can be 10 nm, 100 nm, 200 nm, 300 nm, 400 nm, 500 nm, 600 nm, 700 nm, 800 nm, 900 nm, 1000 nm, but is not limited to the listed values, and other unlisted values within this range are also applicable. When the above thickness is used, on one hand, the thickness of the first doped polysilicon layer 7 can prevent the metal paste from etching downward the first tunneling layer 6 and the semiconductor substrate 1 during preparation of the first metal electrode 12. On the other hand, it can be avoided that the thickness of the first doped polysilicon layer 7 affects the light absorption effect.

A second tunneling layer 2 and a second doped polysilicon layer 3 are sequentially stacked on the back surface of the semiconductor substrate 1, and a second metal electrode 5 is in contact with the second doped polysilicon layer 3, and the second doped polysilicon layer 3 is a second conductivity type doped polysilicon layer. In addition, a second dielectric layer 4 may also be provided on the surface of the second doped polysilicon layer 3 facing away from the second tunneling layer 2. The second dielectric layer 4 is a dielectric layer on the back surface of the semiconductor substrate.

During preparation, along the direction away from the back surface of the semiconductor substrate 1, a second tunneling layer 2, a second doped polysilicon layer 3 and a second metal electrode 5 are sequentially stacked on the back surface of the semiconductor substrate 1. The second metal electrode 5 is a metal electrode on the back surface of the semiconductor substrate.

The solar cell in this application is a passivated contact solar cell. During preparation, the metal-semiconductor substrate contact areas on the front surface and the back surface of the semiconductor substrate 1 can be passivated at the same time to reduce carrier recombination in the contact areas on both surfaces. In addition, the emitter is provided on the back surface, which can reduce carrier recombination in the non-contact area of the front surface, thereby achieving higher open circuit voltage and higher conversion efficiency than conventional Topcon.

In the embodiment of the present application, the non-metal contact area a can be arranged in different ways. Each will be explained below in conjunction with the accompanying drawings.

Figure 2:
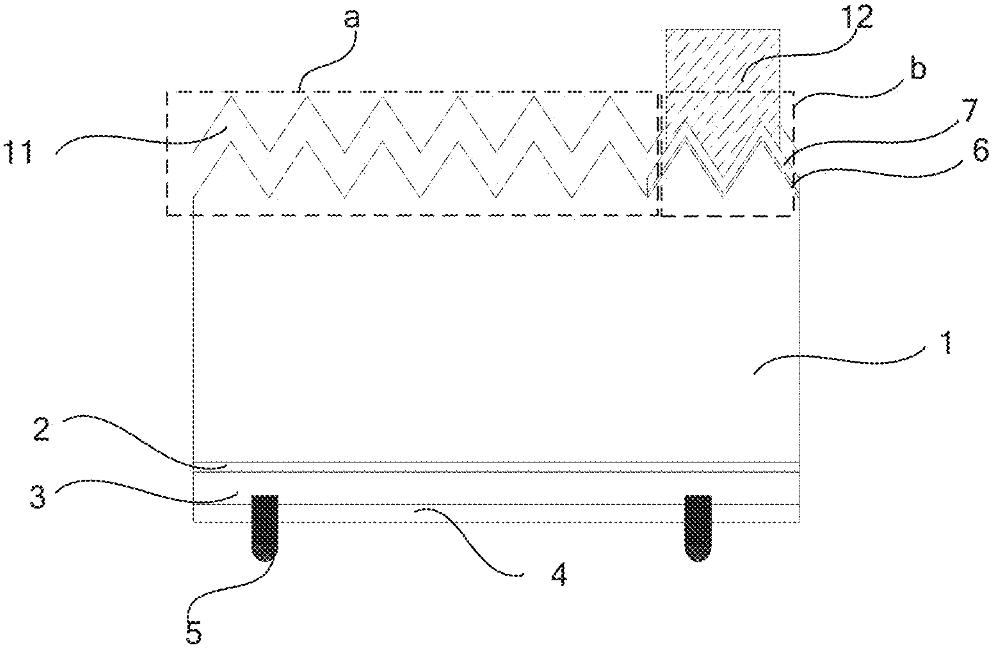
FIG. 2 is a structural schematic diagram of a solar cell structure provided by a specific embodiment of the present application.

Referring to FIG. 2, FIG. 2 shows a specific arrangement of the non-metal contact area. In FIG. 2, the non-metal contact area a is only covered with a dielectric layer (dielectric layer on the front surface of the semiconductor substrate). For the purpose of description, this dielectric layer is defined as the first dielectric layer 11.

When the first dielectric layer 11 is provided, the first dielectric layer 11 is used to passivate the surface of the non-metal contact area a, and the first dielectric layer 11 serves as an anti-reflection film, which can reduce the reflection loss of incident light and increase the efficiency of incident light. Since the surface of the non-metal contact area a is not doped, the surface recombination current is very small after passivation through the first dielectric layer 11.

The first dielectric layer 11 includes, but is not limited to, a laminated film composed of one, two, and more than two of dielectric layers such as silicon nitride, silicon oxide, silicon oxynitride, silicon carbide, aluminum oxide, gallium oxide, zinc oxide, titanium oxide, magnesium fluoride, etc. In the embodiment of this application, no specific limitation is made.

Figure 3:
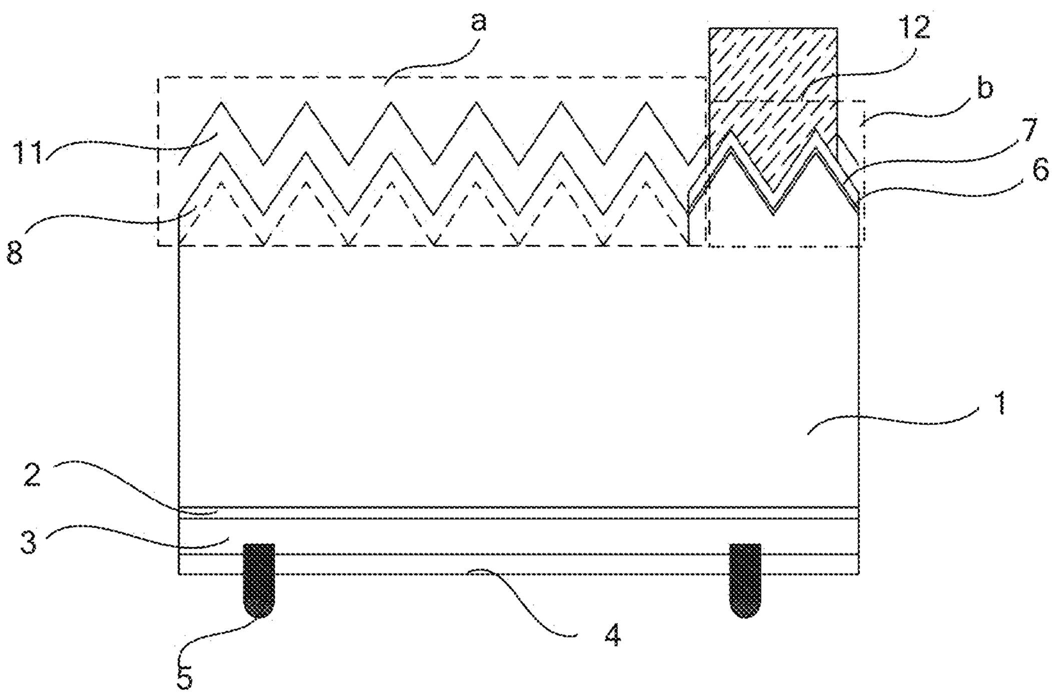
FIG. 3 is a structural schematic diagram of a solar cell structure provided by a specific embodiment of the present application.

Referring to FIG. 3, FIG. 3 shows another solar cell structure provided by an embodiment of the present application. FIG. 3 shows that the non-metal contact area a of the semiconductor substrate 1 is doped with a first lightly doped layer 8, and the first lightly doped layer 8 is covered with the first dielectric layer 11.

For example, when disposed, along the direction away from the front surface of the semiconductor substrate 1, the non-metal contact area a of the semiconductor substrate 1 is doped to form the first lightly doped layer 8. The first lightly doped layer 8 is a lightly doped layer of the first conductivity type in the non-contact area. Doping methods include but are not limited to thermal diffusion, ion implantation, source-containing paste printing, etc.

The first lightly doped layer 8 is used to form a front surface field, increasing the transmission length of carriers, and increasing the open circuit voltage. Moreover, since the first lightly doped layer 8 is a lightly doped layer, the requirements for the passivation quality of the first dielectric layer 11 are not as high as those of the undoped layer (semiconductor substrate 1). Therefore, the process complexity of preparing the first dielectric layer 11 can be reduced without affecting the passivation quality and cell efficiency.

When the first lightly doped layer 8 is provided, the first lightly doped layer 8 is very thin. The depth of doping ions of the first conductivity type into the substrate surface is very shallow, and the surface recombination current is low. For example, the thickness of the first doped polysilicon layer 7 is greater than the thickness of the first lightly doped layer 8.

When the first lightly doped layer 8 is formed, the sheet resistance of the first lightly doped layer 8 is 50~1000 ohm/sq. For example, it can be 50 ohm/sq, 100 ohm/sq, 200 ohm/sq, 300 ohm/sq, 400 ohm/sq, 500 ohm/sq, 600 ohm/sq, 700 ohm/sq, 800 ohm/sq, 900 ohm/sq, 1000 ohm/sq, etc. However, it should be understood that the sheet resistance of the first lightly doped layer 8 in the example of this application is not limited to the listed values, and other unlisted values within the range are also applicable.

When the semiconductor substrate 1 is an N-type semiconductor, the first lightly doped layer 8 is N-type doped, and the doping element is phosphorus, when the semiconductor substrate 1 is a P-type semiconductor, the first lightly doped layer 8 is P-type doped, the doping element is boron.

For the structure of the back surface of the semiconductor substrate 1 shown in FIG. 3, reference can be made to the relevant description in FIG. 2, and details will not be described again here.

Figure 4:
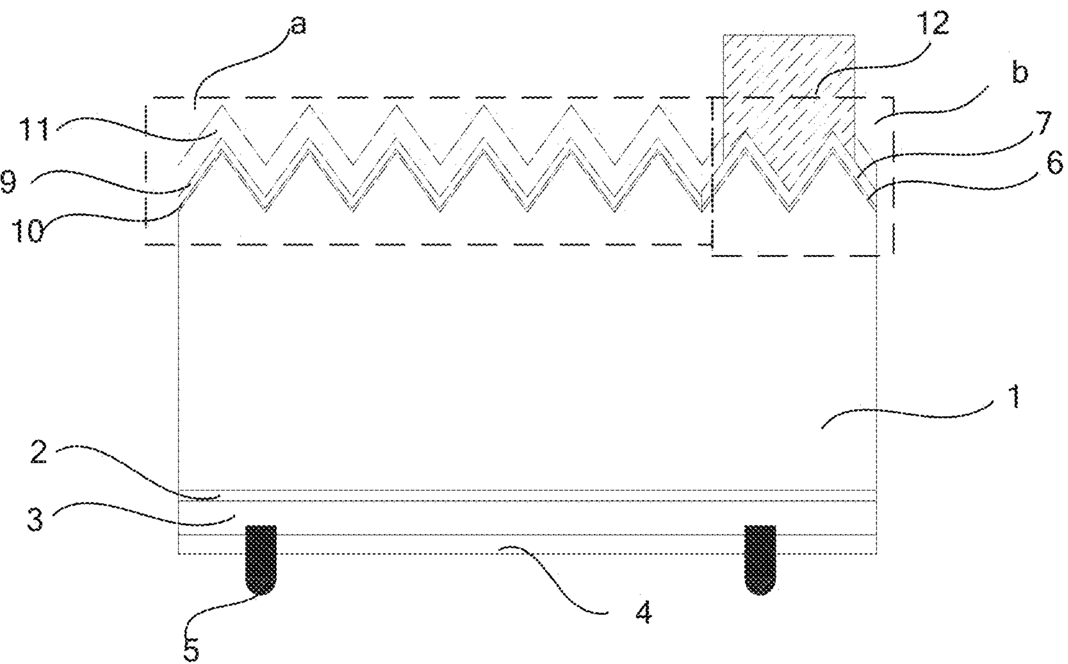
FIG. 4 is a structural schematic diagram of a solar cell structure provided by a specific embodiment of the present application.

Referring to FIG. 4, FIG. 4 shows the structure of another solar cell provided by an embodiment of the present application. In the solar cell shown in FIG. 4, a third tunneling layer 10, a third doped polysilicon layer 9 and a first dielectric layer 11 are provided in the non-metal contact area a. Among them, the third tunneling layer 10 is the tunneling layer of the non-metal contact area a, the third doped polysilicon layer 9 is the first conductivity type doped polysilicon layer of the non-metal contact area a, and the first dielectric layer 11 is a dielectric layer on the front surface of the semiconductor substrate.

Exemplarily, along the direction away from the front surface of the semiconductor substrate 1, the non-metal contact area a is provided with a third tunneling layer 10, a third doped polysilicon layer 9 and a first dielectric layer 11 in sequence. Among them, the third tunneling layer 10 is prepared in the non-metal contact area a, the third doped polysilicon layer 9 covers the third tunneling layer 10, and the first dielectric layer 11 covers the third doped polysilicon layer 9. Wherein, the third doped polysilicon layer 9 and the semiconductor substrate 1 have the same conductivity type, and both are the first conductivity type.

When the above structure is adopted, the third tunneling layer 10 and the third doped polysilicon layer 9 are stacked on the non-metal contact area a. Among them, the third tunneling layer 10 is used to passivate the front surface of the semiconductor substrate 1, and the third doped polysilicon layer 9 serves as a front surface field, which can increase the carrier transmission length and increase the open circuit voltage.

When the third tunneling layer 10 is provided, the first tunneling layer 6 and the third tunneling layer 10 are provided in the same layer, and the thickness of the first tunneling layer 6 may be greater than or equal to the thickness of the third tunneling layer 10. The above-mentioned same-layer arrangement can be like this: when the first tunneling layer 6 and the third tunneling layer 10 are prepared, they are located in the same layer structure, and their lower surfaces are located on the same surface (the front surface of the semiconductor substrate 1), and there may be a difference in height between the first tunneling layer 6 and the third tunneling layer 10 away from the surface of the semiconductor substrate 1. The difference may be a process difference during process preparation, or a difference caused by etching and thinning the third tunneling layer 10. For example, during preparation, tunneling layers may be simultaneously prepared in the metal contact area b and the non-metal contact area a of the semiconductor substrate 1 to form the first tunneling layer 6 and the third tunneling layer 10. When the first tunneling layer 6 and the third tunneling layer 10 are prepared using the above preparation method, the first tunneling layer 6 and the third tunneling layer 10 have an integrally formed structure.

If the third tunneling layer 10 is too thick, it will affect the tunneling and collection of carriers, and if the third tunneling layer 10 is too thin, it will affect the passivation effect of the semiconductor substrate 1. Therefore, in the embodiment of the present application, the thickness of the third tunneling layer 10 ranges from 0.5 to 3 nm. For example, the thickness of the third tunneling layer 10 may be 0.5 nm, 1 nm, 1.5 nm, 2 nm, 2.5 nm, or 3 nm. It should be understood that the thickness of the third tunneling layer 10 is not limited to the listed values, and other unlisted values within the range are also applicable.

When the third doped polysilicon layer 9 is provided, since the third doped polysilicon layer 9 has a large light absorption coefficient, the thicker the third doped polysilicon layer 9 is, the more light loss is caused. Therefore, in the embodiment of the present application, the thickness of the third doped polysilicon layer 9 is very thin. For example, the thickness of the first doped polysilicon layer 7 is greater than the thickness of the third doped polysilicon layer 9, in order to reduce light loss.

In addition, the third doped polysilicon layer 9 can be provided in the same layer as the first doped polysilicon layer 7, that is, the first doped polysilicon layer 7 and the third doped polysilicon layer 9 can be prepared on the same layer. During preparation, the first doped polysilicon layer 7 and the third doped polysilicon layer 9 are located in the same layer structure, wherein, the first doped polysilicon layer 7 is located on the surface of the first tunneling layer 6 facing away from the semiconductor substrate 1, and the third doped polysilicon layer 9 is located on the surface of the third tunneling layer 10 facing away from the semiconductor substrate 1. In addition, when disposed, the thickness of the first doped polysilicon layer 7 is greater than the thickness of the third doped polysilicon layer 9. For example, doped polysilicon layers can be simultaneously prepared in the metal contact area b and the non-metal contact area a of the semiconductor substrate 1, and then the doped polysilicon layer located in the non-metal contact area a is thinned by etching or other means, so as to form a third doped polysilicon layer 9. When the first doped polysilicon layer 7 and the third doped polysilicon layer 9 are prepared using the above preparation method, the first doped polysilicon layer 7 and the third doped polysilicon layer 9 have an integrally formed structure.

As an example, the thickness of the third doped polysilicon layer 9 is 1~1000 nm. Exemplarily, the thickness of the third doped polysilicon layer 9 is 10 nm, 100 nm, 200 nm, 300 nm, 400 nm, 500 nm, 600 nm, 700 nm, 800 nm, 900 nm, 1000 nm, but not limited to the listed values, and other unlisted values within the range are also applicable.

The sheet resistance of the third doped polysilicon layer 9 is 1~1000 ohm/sq. For example, it can be 1 ohm/sq, 100 ohm/sq, 200 ohm/sq, 300 ohm/sq, 400 ohm/sq, 5000 hm/sq, 600 ohm/sq, 700 ohm/sq, 800 ohm/sq, 900 ohm/sq, 1000 ohm/sq, but not limited to the listed values, and other unlisted values within the range are also applicable.

When the semiconductor substrate 1 is an N-type semiconductor, the third doped polysilicon layer 9 is N-type doped, and the doping element is phosphorus, when the semiconductor substrate 1 is a P-type semiconductor, the third doped polysilicon layer 9 is P-type doped, and the doping element is boron.

For the structure of the back surface of the semiconductor substrate 1 shown in FIG. 4, reference can be made to the relevant description in FIG. 2, and details will not be described again here.

Figure 5:
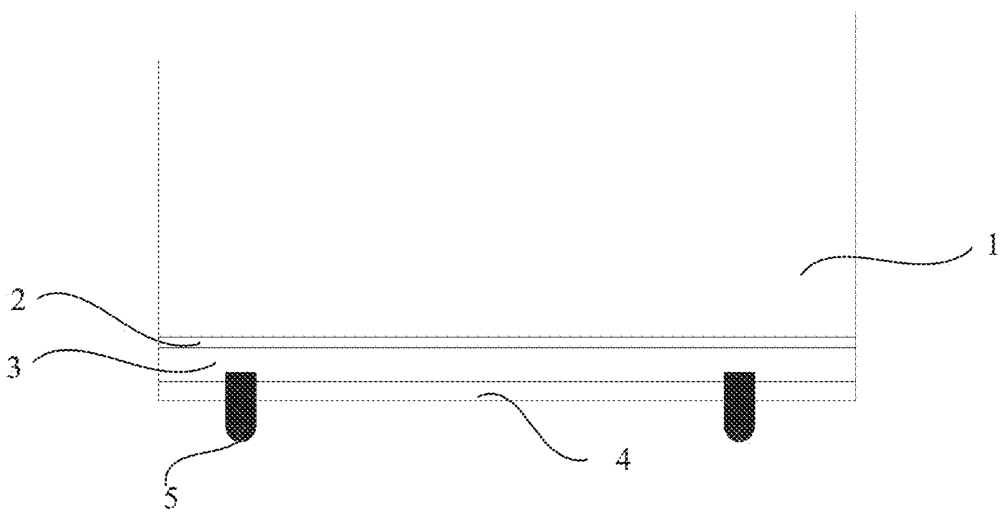
FIG. 5 is a schematic view of the back surface of a solar cell structure provided by a specific embodiment of the present application.

Referring to FIG. 5, a second tunneling layer 2, a second doped polysilicon layer 3 and a second dielectric layer 4 are sequentially stacked on the back surface of the semiconductor substrate 1, and a second metal electrode 5 is in contact with the second doped polysilicon layer 3. The second doped polysilicon layer 3 is a doped polysilicon layer of the second conductivity type. The second dielectric layer 4 is a dielectric layer on the back surface of the semiconductor substrate.

During preparation, along a direction away from the back surface of the semiconductor substrate 1, a second tunneling layer 2, a second doped polysilicon layer 3 and a second metal electrode 5 are sequentially stacked on the back surface of the semiconductor substrate 1. The second metal electrode 5 is a metal electrode on the back surface of the semiconductor substrate.

The solar cell in this application is a passivated contact solar cell. During preparation, the metal-semiconductor substrate contact areas on the front surface and the back surface of the semiconductor substrate 1 can be passivated at the same time to reduce carrier recombination in the contact areas on both surfaces, and the emitter is provided on the back surface, which can reduce carrier recombination in the non-contact area of the front surface, thereby achieving higher open circuit voltage and higher conversion efficiency than conventional Topcon.

The thickness of the second tunneling layer 2 on the back surface of the semiconductor substrate 1 is ≤3 nm. For example, it can be 1 nm, 1.5 nm, 2 nm, 2.5 nm, or 3 nm, but it is not limited to the listed values, and other unlisted values within the range are also applicable.

The thickness of the second doped polysilicon layer 3 on the back surface of the semiconductor substrate 1 is 10~1000 nm, for example, it can be 10 nm, 100 nm, 200 nm, 300 nm, 400 nm, 500 nm, 600 nm, 700 nm, 800 nm, 900 nm, 1000 nm, but is not limited to those listed values, and other unlisted values within the range are also applicable.

The conductivity type of the second doped polysilicon layer 3 is opposite to the conductivity type of the semiconductor substrate 1. For example, when the semiconductor substrate 1 is an N-type semiconductor, the second doped polysilicon layer 3 is P-type doped, and the doping element is boron, when the semiconductor substrate 1 is a P-type semiconductor, the second doped polysilicon layer 3 is N-type doped, and the doping element is phosphorus.

As an example, when the semiconductor substrate 1 is prepared, the front surface of the semiconductor substrate 1 is a textured surface. It should be noted that the front surface of the semiconductor substrate 1 in this application can be a conventional textured surface or a combination of other types of complete and incomplete textured surfaces, and the specific selection depends on the actual situation.

The back surface of the semiconductor substrate 1 may be a textured surface or a polished surface, that is, the entire back surface of the semiconductor substrate 1 may be a textured surface, or the entire back surface may be a polished surface.

In addition, the back surface of the semiconductor substrate 1 may also be at least partially textured or at least partially polished. The back surface of the semiconductor substrate 1 is at least partially textured refers to a part of the back surface of the semiconductor substrate 1 is textured, or the entire back surface of the semiconductor substrate 1 is textured, and the back surface of the semiconductor substrate 1 is at least partially polished refers to a part of the back surface of the semiconductor substrate 1 is polished, or the entire back surface of the semiconductor substrate 1 is polished.

When the back surface of the semiconductor substrate 1 is at least partly textured or at least partly polished, it includes but is not limited to: the entire back surface of the semiconductor substrate 1 is polished, or the entire surface is textured, or a part of the entire surface is polished and a part of the entire surface is textured.

As can be seen from the above description, the back surface of the semiconductor substrate 1 in this application can be a complete or incomplete textured surface (or a combination thereof), a polished surface (acid polished, alkali polished, or a combination thereof), as well as a partial textured surface, or a partial polished surface etc., and the specific choice depends on the actual situation.

The second tunneling layer 2 is a dielectric film with carrier tunneling effect and interface passivation effect. For example, the second tunneling layer 2 may be a dielectric film of silicon oxide or aluminum oxide.

In the embodiment of the present application, dielectric layers are provided on the outer surface of the semiconductor substrate 1, including a first dielectric layer 11 on the front surface of the semiconductor substrate and a second dielectric layer 4 on the back surface of the semiconductor substrate. The material of the dielectric layers includes one and a combination of two or more of silicon nitride, silicon oxide, silicon oxynitride, silicon carbide, aluminum oxide, gallium oxide, zinc oxide, titanium oxide or magnesium fluoride.

Superposing an ultra-thin second tunneling layer 2 and a second doped polysilicon layer 3 between the back surface of the semiconductor substrate 1 (non-main light-receiving surface) and the second metal electrode 5 can significantly reduce the carrier recombination of the metal-semiconductor contact areas and thereby greatly improve the efficiency of solar cells. Among them, the second tunneling layer 2 is used on the back surface of the semiconductor substrate 1, with a thickness of 0.5-3 nm, the second doped polysilicon layer 3 is used to form the emitter on the back surface, and forms a good electrical connection with the second metal electrode 5, and its surface concentration is 1e18~1e22 $cm^{-3}$. The outermost second dielectric layer 4 on the back surface is used to further passivate the back surface of the semiconductor substrate 1, and as an anti-reflection film, the second dielectric layer 4 can reduce the reflection loss of incident light and increase the utilization rate of incident light.

It should be noted that the preparation method of the second tunneling layer 2 in this application includes but is not limited to the thermal oxygen method, the wet chemical method, the PECVD method, the ALD method or the excimer source dry oxygen method. In the embodiments of the present application, the above preparation method can also be used for other tunneling layers.

The doped polysilicon layers (the first doped polysilicon layer 7, the second doped polysilicon layer 3 and the third doped polysilicon layer 9) in this application can be prepared by a chemical vapor deposition (CVD) method, including but not limited to LPCVD, PECVD, etc., and then undergo heat treatment to form polysilicon. The doping method can be in-situ doping or ex-situ doping. Ex-situ doping includes but is not limited to thermal diffusion, ion implantation, source-containing paste printing, etc.

The metal electrodes (the first metal electrode 12 and the second metal electrode) in this application can be screen-printed metal paste, electroplated metal, or inkjet-printed metal, laser transferred metal, or evaporated metal. The specific selection depends on the actual situation. The dielectric layer may or may not have holes in the metal contact area b by means of laser, etching, etc.

The applicant declares that the above are only embodiments of the present application, and the protection scope of the present application is not limited thereto. Those skilled in the art should understand that any changes or substitutions that can be easily conceived by those skilled in the art within the technical scope disclosed in this application fall within the protection scope and disclosure scope of this application.

The invention claimed is:

1. A solar cell comprising:

a semiconductor substrate, a first tunneling layer, a first doped polysilicon layer, a first metal electrode, a second tunneling layer, an emitter including a second doped polysilicon layer, a second metal electrode, a third tunneling layer, and a third doped polysilicon layer;

wherein the front surface of the semiconductor substrate has a metal contact area and a non-metal contact area;

wherein along the direction away from the front surface of the semiconductor substrate, the first tunneling layer, the first doped polysilicon layer and the first metal electrode are sequentially stacked on the metal contact area, wherein the first metal electrode is electrically connected to the first doped polysilicon layer;

wherein along the direction away from the back surface of the semiconductor substrate, the second tunneling layer, the emitter including the second doped polysilicon layer and the second metal electrode are sequentially stacked on the back surface of the semiconductor substrate;

wherein the front surface of the semiconductor substrate is the main light-receiving surface, and the back surface of the semiconductor substrate is the non-main light-receiving surface, the semiconductor substrate and the first doped polysilicon layer have the same conductivity type, and the semiconductor substrate and the second doped polysilicon layer have different conductivity types; and wherein along the direction away from the front surface of the semiconductor substrate, the third tunneling layer and the third doped polysilicon layer are sequentially stacked on the non-metal contact area, and the thickness of the first doped polysilicon layer is greater than the thickness of the third doped polysilicon layer; and the thickness of the first tunneling layer is greater than the thickness of the third tunneling layer.

2. The solar cell according to claim 1, further comprising a first dielectric layer, wherein the non-metal contact area is covered with the first dielectric layer, and the third doped polysilicon layer is disposed between the first dielectric layer and the third tunneling layer.

3. The solar cell according to claim 1, wherein the first tunneling layer and the third tunneling layer are regions of a same tunneling layer, the first doped polysilicon layer and the third doped polysilicon layer are regions of a same polysilicon layer.

4. The solar cell according to claim 1, wherein the thickness of the third tunneling layer is ≤3 nm, the thickness of the third doped polysilicon layer is 1~1000 nm, and the sheet resistance of third doped polysilicon layer is 1~1000 ohm/sq.

5. The solar cell according to claim 2, wherein the semiconductor substrate includes a first lightly doped region under the non-metal contact area of the front surface of the semiconductor substrate, and the first lightly doped region is covered with the first dielectric layer.

6. The solar cell according to claim 5, wherein the sheet resistance of the first lightly doped region is 50-1000 ohm/sq.

7. The solar cell according to claim 2, wherein the first dielectric layer includes any one or any combination of silicon nitride, silicon oxide, silicon oxynitride, silicon carbide, aluminum oxide, gallium oxide, zinc oxide, titanium oxide or magnesium fluoride.

8. The solar cell according to claim 1, wherein the front surface of the semiconductor substrate is textured.

9. The solar cell according to claim 1, wherein the thickness of the second tunneling layer is ≤3 nm, and the thickness of the second doped polysilicon layer is 10-1000 nm.

10. The solar cell according to claim 1, wherein the back surface of the semiconductor substrate is textured or polished.

11. The solar cell according to claim 1, wherein the back surface of the semiconductor substrate is at least partly textured or at least partly polished.

12. The solar cell according to claim 1, wherein the first tunneling layer and the second tunneling layer are dielectric films with carrier tunneling effect and interface passivation effect.

13. The solar cell according to claim 12, wherein the first tunneling layer and the second tunneling layer are dielectric films of silicon oxide or aluminum oxide.

14. The solar cell according to claim 1, wherein the thickness of the first tunneling layer is ≤3 nm, and the thickness of the first doped polysilicon layer is 10-1000 nm.

15. A solar cell comprising:

a semiconductor substrate, a first tunneling layer, a first doped polysilicon layer, a first metal electrode, a second tunneling layer, an emitter including a second doped polysilicon layer, and a second metal electrode;

wherein the front surface of the semiconductor substrate has a metal contact area and a non-metal contact area;

wherein along the direction away from the front surface of the semiconductor substrate, the first tunneling layer, the first doped polysilicon layer and the first metal electrode are sequentially stacked on the metal contact area, wherein the first metal electrode is electrically connected to the first doped polysilicon layer;

wherein along the direction away from the back surface of the semiconductor substrate, the second tunneling layer, the emitter including the second doped polysilicon layer and the second metal electrode are sequentially stacked on the back surface of the semiconductor substrate; and wherein the front surface of the semiconductor substrate is the main light-receiving surface, and the back surface of the semiconductor substrate is the non-main light-receiving surface, the semiconductor substrate and the first doped polysilicon layer have the same conductivity type, and the semiconductor substrate and the second doped polysilicon layer have different conductivity types;

wherein the semiconductor substrate includes a base region and a first lightly doped region, the first lightly doped region is located under the non-metal contact area of the front surface of the semiconductor substrate, the first lightly doped region is in direct contact with the base region, the doping concentration of the first lightly doped region is greater than that of the base region and less than that of the first doped polysilicon layer, and the thickness of the first doped polysilicon layer is greater than the thickness of the first lightly doped region.

* * * * *